US010587242B2

(12) United States Patent
Jeung

(10) Patent No.: US 10,587,242 B2
(45) Date of Patent: Mar. 10, 2020

(54) ACOUSTIC WAVE FILTER AND METHOD FOR MANUFACTURING THE SAME

(71) Applicant: Samsung Electro-Mechanics Co., Ltd., Suwon-si (KR)

(72) Inventor: Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 164 days.

(21) Appl. No.: 15/266,515

(22) Filed: Sep. 15, 2016

(65) Prior Publication Data

US 2017/0244385 A1 Aug. 24, 2017

(30) Foreign Application Priority Data

Feb. 22, 2016 (KR) .................. 10-2016-0020398

(51) Int. Cl.
| | | |
|---|---|---|
| *H03H 9/54* | (2006.01) | |
| *H01L 41/316* | (2013.01) | |
| *H01L 41/332* | (2013.01) | |
| *H03H 9/60* | (2006.01) | |
| *H01L 41/047* | (2006.01) | |
| *H01L 41/29* | (2013.01) | |
| *H01L 41/31* | (2013.01) | |
| *H03H 9/02* | (2006.01) | |
| *H03H 3/02* | (2006.01) | |
| *H03H 3/04* | (2006.01) | |

(52) U.S. Cl.
CPC .......... *H03H 9/542* (2013.01); *H01L 41/047* (2013.01); *H01L 41/29* (2013.01); *H01L 41/31* (2013.01); *H01L 41/316* (2013.01); *H01L 41/332* (2013.01); *H03H 3/02* (2013.01); *H03H 3/04* (2013.01); *H03H 9/60* (2013.01); *H03H 2003/0464* (2013.01); *H03H 2009/02204* (2013.01)

(58) Field of Classification Search
CPC ........ H03H 9/132; H03H 9/542; H03H 9/582; H03H 9/60; H03H 2009/02173; H03H 2009/02204; H03H 3/02; H03H 3/04; H03H 2003/021; H03H 2003/028; H03H 2003/0414; H03H 2003/0464; H01L 41/047; H01L 41/29; H01L 41/31; H01L 41/311; H01G 7/00; H01G 7/06
USPC .................................................. 333/188, 189
See application file for complete search history.

(56) References Cited

U.S. PATENT DOCUMENTS

| | | | |
|---|---|---|---|
| 6,236,281 B1 | 5/2001 | Nguyen et al. | |
| 6,262,637 B1 * | 7/2001 | Bradley | ................. H03H 9/568 310/322 |

(Continued)

FOREIGN PATENT DOCUMENTS

| | | | |
|---|---|---|---|
| KR | 2001-0097701 A | | 11/2001 |
| KR | 2002-0071656 | * | 9/2002 |

OTHER PUBLICATIONS

English language machine translation of KR 2002-0071656 A, published Sep. 13, 2002, 12 pages.*

*Primary Examiner* — Barbara Summons
(74) *Attorney, Agent, or Firm* — NSIP Law

(57) ABSTRACT

An acoustic wave filter includes a substrate, a first resonator disposed on the substrate, a second resonator disposed on the substrate to be spaced apart from the first resonator, a connector electrically connecting the first and second resonators, and a variable capacitor formed in the connector to tune a pass band frequency of the acoustic wave filter.

17 Claims, 5 Drawing Sheets

(56) References Cited

U.S. PATENT DOCUMENTS

| | | | | |
|---|---|---|---|---|
| 6,441,703 B1* | 8/2002 | Panasik | ............... | H03H 9/589 |
| | | | | 29/25.35 |
| 6,566,979 B2* | 5/2003 | Larson, III | ............ | H03H 3/04 |
| | | | | 29/25.35 |
| 6,653,913 B2* | 11/2003 | Klee | .................... | H03H 3/04 |
| | | | | 333/188 |
| 6,924,583 B2* | 8/2005 | Lin | ..................... | H03H 3/04 |
| | | | | 310/312 |
| 7,688,161 B2* | 3/2010 | Miura | ............. | H03H 9/6483 |
| | | | | 310/313 B |
| 7,738,237 B2* | 6/2010 | Lee | ..................... | H01G 7/06 |
| | | | | 361/303 |
| 7,834,524 B2 | 11/2010 | Wang et al. | | |
| 8,756,778 B2* | 6/2014 | Bar | ..................... | H01G 4/228 |
| | | | | 29/25.42 |
| 2005/0007291 A1* | 1/2005 | Fabrega-Sanchez | ................. | |
| | | | | G01R 27/2694 |
| | | | | 343/860 |
| 2007/0209176 A1 | 9/2007 | Kawakubo et al. | | |
| 2008/0190204 A1* | 8/2008 | Danel | ........... | G01C 19/5755 |
| | | | | 73/514.32 |
| 2012/0286900 A1* | 11/2012 | Kadota | ......... | H03H 9/02559 |
| | | | | 333/188 |
| 2013/0342285 A1* | 12/2013 | Kadota | ............... | H01G 7/06 |
| | | | | 333/188 |

\* cited by examiner

ACOUSTIC WAVE FILTER AND METHOD FOR MANUFACTURING THE SAME

CROSS-REFERENCE TO RELATED APPLICATION(S)

This application claims benefit of priority under 35 U.S.C. § 119(a) to Korean Patent Application No. 10-2016-0020398 filed on Feb. 22, 2016 in the Korean Intellectual Property Office, the entire disclosure of which is incorporated herein by reference for all purposes.

BACKGROUND

1. Field

The present disclosure relates to an acoustic wave filter and a method for manufacturing the same.

2. Description of Related Art

In a band pass filter, obtaining an appropriate band is an important feature that affects the application of the filter. Such a band may be obtained by adjusting a resonant frequency of a resonator, for example, a series resonance frequency (Fs) and a parallel resonance frequency (Fp).

One method for adjusting the resonant frequency is by physically decreasing a thickness of the resonator by performing a trimming process on a wafer after manufacturing the resonator.

Because the trimming process generally includes an etching step to decrease a thickness of the resonator to tune the resonant frequency of the resonator, it may be difficult to only trim a separate filter (i.e., a separate resonator). Thus, undesirable effects such as dispersion may occur, depending on a machining process condition.

Moreover, a fabrication processes such as photolithography may be required for performing the selective etching steps in trimming the resonator. This may undesirably degrade a yield while manufacturing the filter.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an general aspect, an acoustic wave filter includes a substrate, a first resonator disposed on the substrate, a second resonator disposed on the substrate and spaced apart from the first resonator, a first connector and a second connector electrically connecting the first and second resonators, and a variable capacitor formed in the first connector and the second connector to tune a pass band frequency of the acoustic wave filter.

The variable capacitor may include a first electrode disposed in the first connector, and a second electrode disposed in the second connector.

The first electrode may include a first plate, and first extensions extend from the first plate, the first extensions being spaced apart from each other.

The second electrode may include a second plate, and second extensions extend from the second plate, the second extensions being spaced apart from each other. The second extensions are disposed to be inserted into spaces formed by the first extensions, such that the first extensions and second extensions are alternately disposed.

The first resonator may include a first lower electrode disposed on the substrate, a first piezoelectric body disposed on a top surface of the first lower electrode, and a first upper electrode disposed on a top surface of the first piezoelectric body. The top surface of the first lower electrode is disposed opposite a bottom surface of the first lower electrode, and the bottom surface of the first lower electrode faces the substrate.

The second resonator may include a second lower electrode disposed on the substrate, a second piezoelectric body disposed on a top surface of the second lower electrode, and a second upper electrode disposed on a top surface of the second piezoelectric body. The top surface of the second lower electrode is disposed opposite a bottom surface of the second lower electrode, and the bottom surface of the second lower electrode faces the substrate.

The substrate may include voids on which the first and second resonators are disposed.

The variable capacitor may include a first electrode having first extensions and a second electrode having second extensions, the first extensions and the second extensions being interdigitated.

The variable capacitor is configured to have capacitance dependent on a voltage applied across electrodes of the variable capacitor.

In another general aspect, a method for manufacturing an acoustic wave filter may include forming a first connector and a second connector on a substrate, forming a variable capacitor in the first connector and the second connector, respectively, forming a first resonator and a second resonator on the substrate to be connected to the first connector and the second connector, respectively, and be disposed on both terminals of the variable capacitor, and tuning a pass band frequency of the acoustic wave filter by applying a voltage to the variable capacitor.

The tuning the frequency may include applying the voltage to the variable capacitor by connecting tuning electrodes to the first connector and the second connector connected to both terminals of the variable capacitor, respectively.

The forming of the first and second resonators may include forming a first lower electrode and a second lower electrode to be disposed on voids of the substrate, forming a first piezoelectric body and a second piezoelectric body on the first lower electrode and the second lower electrode respectively, and forming a first upper electrode and a second upper electrode on the first piezoelectric body and the second piezoelectric body respectively.

The variable capacitor may include a first electrode formed in the first connector, and a second electrode disposed in the second connector.

The first electrode may include a first plate having first extensions extending therefrom, the first extensions being spaced apart from each other.

The second electrode may include a second plate having second extensions extending therefrom, the second extensions being spaced apart from each other. The second extensions are disposed to be inserted into spaces formed by the first extensions, such that the first extensions and the second extensions are alternately disposed.

The first resonator may include a first lower electrode disposed on the substrate, a first piezoelectric body disposed on a top surface of the first lower electrode, and a first upper electrode disposed on a top surface of the first piezoelectric body. The top surface of the first lower electrode is disposed opposite a bottom surface of the first lower electrode, and the bottom surface of the first lower electrode faces the substrate.

The second resonator may include a second lower electrode disposed on the substrate, a second piezoelectric body disposed on a top surface of the second lower electrode, and a second upper electrode disposed on a top surface of the second piezoelectric body. The top surface of the second lower electrode is disposed opposite a bottom surface of the second lower electrode, and the bottom surface of the second lower electrode faces the substrate.

The substrate may include voids on which the first resonator and the second resonator are disposed.

In another general aspect, an acoustic wave filter may include a first resonator disposed on a substrate, a second resonator disposed on the substrate and spatially separated from the first resonator, a variable capacitor electrically connecting the first resonator and the second resonator. The variable capacitor is configured to have a capacitance dependent on a voltage applied across electrodes of the variable capacitor for tuning a pass band frequency of the acoustic wave filter.

The variable capacitor may include interdigitated extensions to each of the electrodes.

The variable capacitor is configured to enable tuning a pass band frequency of the acoustic wave filter without using a trimming layer on the first resonator or the second resonator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
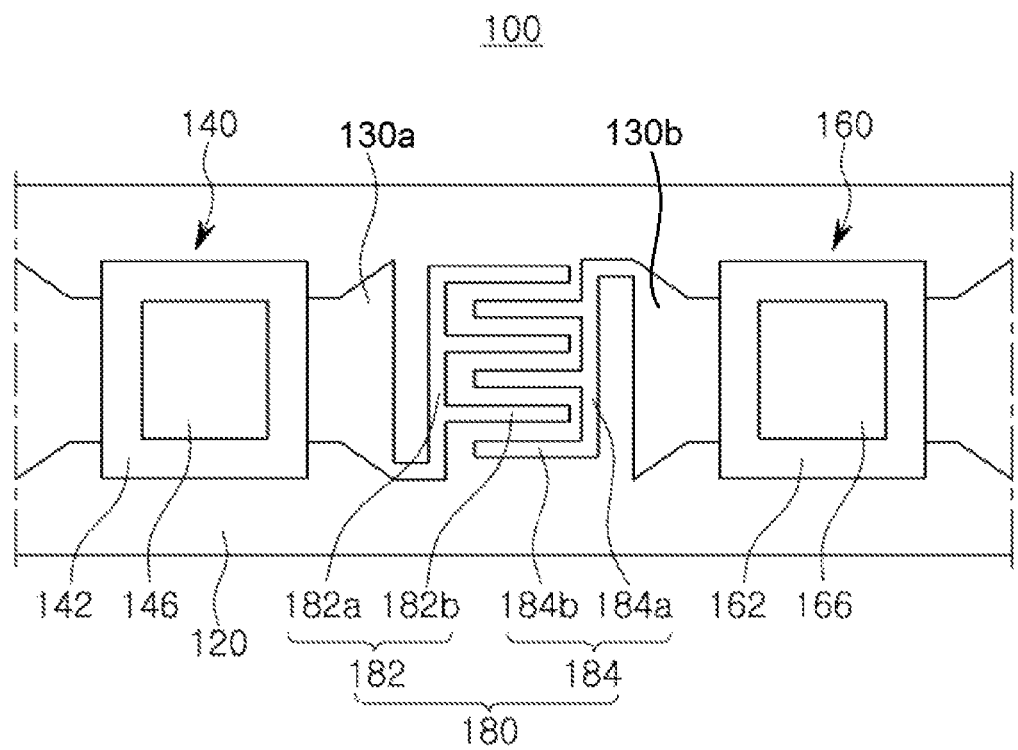
FIG. 1 is a plan view illustrating an acoustic wave filter according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
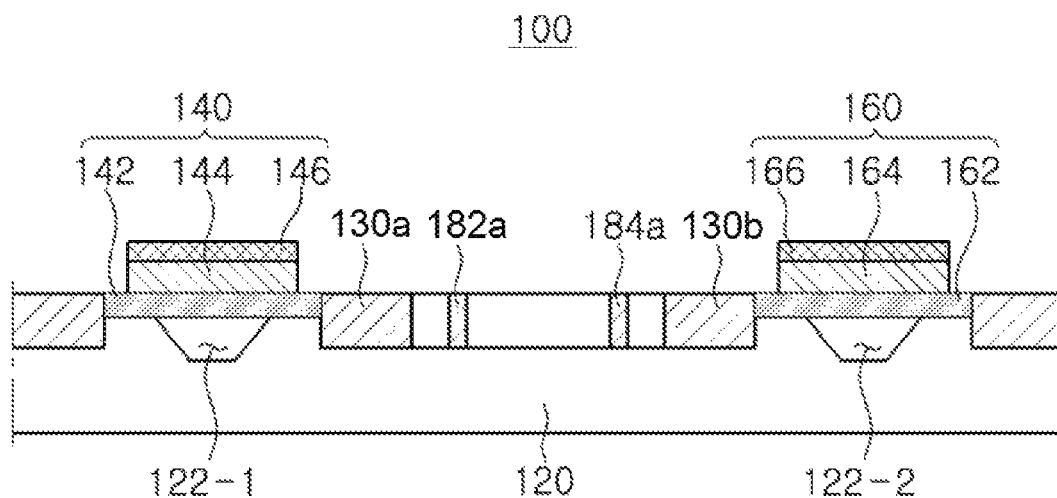
FIG. 2 is a cross-sectional view illustrating an acoustic wave filter according to an embodiment.
Figure 3:
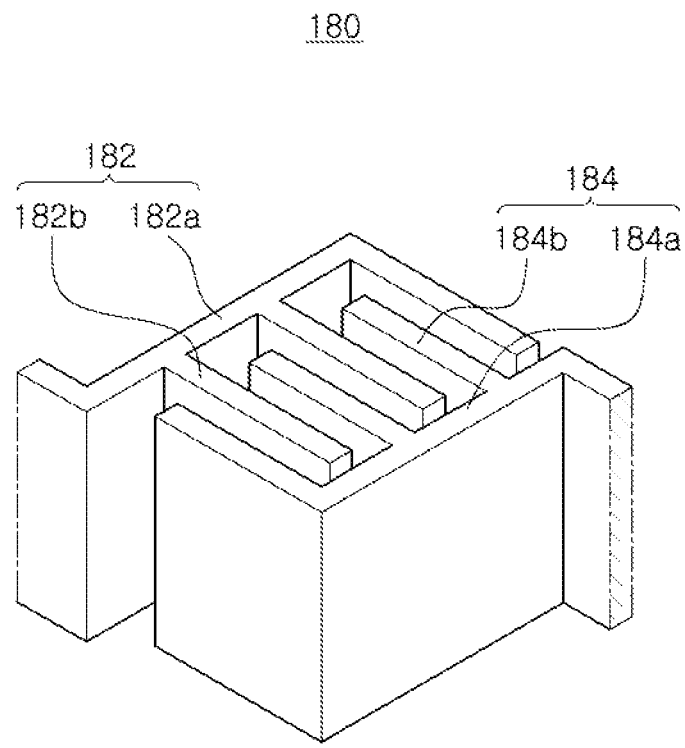
FIG. 3 is a perspective view illustrating a variable capacitor of the acoustic wave filter according to an embodiment.

FIG. 1 is a plan view illustrating an acoustic wave filter according to an embodiment. FIG. 2 is a cross-sectional view illustrating an acoustic wave filter according to an embodiment. FIG. 3 is a perspective view illustrating a variable capacitor of the acoustic wave filter according to an embodiment.

Referring to FIGS. 1 through 3, an acoustic wave filter 100 according to an embodiment in the present disclosure includes a substrate 120, a first resonator 140, a second resonator 160, and a variable capacitor 180.

The substrate 120 may be a suitable semiconductor substrate such as, for example, a silicon substrate, a silicon on insulator (SOI) type substrate, or a substrate of any other material amenable to semiconductor manufacturing processes.

As used herein, the term "suitable" material refers to a material having physical and chemical properties requisite for part or component for which the material is being used. In addition, the material is compatible to the manufacturing methods being used in making or fabricating the part, component, or the device as a whole. While examples are provided for suitable materials where applicable, the disclosure of this application is not limited to the example materials, and encompasses other suitable materials that will be apparent after an understanding of the disclosure of this application.

Voids 122 (122-1, 122-2) are formed in the substrate 120. As an example, the voids 122 may be formed by a groove formed from a top surface of the substrate 120. However, the voids 122 are not limited thereto, but may also be formed by a hole penetrating through the substrate 120. It will be apparent after an understanding of the disclosure of the present application that although FIG. 2 illustrates an example in which two voids 122 are formed in the substrate 120, the number of voids 122 are not limited thereto. In general, an even number of voids 122 are contemplated. However, an acoustic wave filter with an odd number of voids 122 may be designed within the scope of the disclosure of the present application.

Further, while FIG. 2 illustrates the voids 122 having a trapezoidal shape, the cross-sectional shape of the voids 122 is not limited thereto and will depend on the process used to make the cavity forming the voids 122. For example, the walls of the voids 122 may be straight (perpendicular with respect to the top surface of the substrate, or at an acute or obtuse angle) or curved.

Although the figures illustrate embodiments in which the voids 122 are formed in the substrate 120, the voids 122 are not limited thereto. For example, in some embodiments, the voids 122 may be omitted.

Although not explicitly illustrated in the drawings, an insulating layer for electrically isolating the substrate 120 from the first resonator 140 and the second resonator 160 may be formed on the top surface of the substrate 120. The insulating layer may be formed of a suitable dielectric material such as, for example, silicon dioxide ($SiO_2$), silicon nitride ($Si_3N_4$), or aluminum oxide ($Al_2O_3$). The insulating layer may be formed by depositing the dielectric material on the substrate 120 by a suitable method such as, for example, chemical vapor deposition, RF magnetron sputtering, or evaporation.

The substrate 120 further includes a first connector 130a and a second connector 130b for electrically connecting the first resonator 140 and the second resonator 160 to an external power source, respectively. The first connector 130a and the second connector 130b may be disposed between the first resonator 140 and the second resonator 160, and may be disposed to be extended from the first resonator 140 and the second resonator 160 at the same time.

Referring to FIG. 1, the first resonator 140 is disposed on a void 122-1. The first resonator 140 may be a series resonator. In some embodiments, the first resonator 140 may be a bulk acoustic wave filter. As an example, the first resonator 140 may include a first lower electrode 142, a first piezoelectric body 144, and a first upper electrode 146.

The first lower electrode 142 disposed on the void 122-1, may serve to apply a high frequency voltage signal to the first piezoelectric body 144. Accordingly, the first lower electrode 142 may be formed of a suitable electrically conducting material such as, for example, manganese (Mn), gold (Au), aluminum (Al), copper (Cu), and silver (Ag), or conducting alloys thereof. The first lower electrode 142 may have a predetermined thickness and be formed by a suitable thin film deposition process such as, for example, sputtering, CVD, or evaporation, and The first electrode 142 may have any suitable shape such as, for example, a circle, an ellipse, a square, a triangle, a convex regular or irregular polygon, or any other suitable shape that serves to optimize the geometric and acoustic efficiency of the resonators. The shape of the first lower electrode 142 can be provided using a suitable process such as, for example, photolithography.

An thickness of the first lower electrode 142 may be determined by considering factors such as, for example, intrinsic acoustic impedance or density of the material, speed of sound, and a wavelength of an applied or desired signal in order for the bulk acoustic wave (BAW) resonator to exhibit desired resonance characteristics.

In the illustrated embodiment, the first lower electrode 142 has the void 122-1 covering from the top.

In addition, the first lower electrode 142 is connected to the first connector 130a of the substrate 120.

The first piezoelectric body 144 is formed on a top surface of the first lower electrode 142. In such configuration, the first lower electrode 142 is between the substrate 120 and the first piezoelectric body 144. The first piezoelectric body 144 may be formed of a suitable piezoelectric material such as, for example, quartz, zinc oxide (ZnO), aluminum nitride (AlN), lead zirconate titanate (PZT), barium titanate ($BaTiO_3$), or any variations thereof. In addition, the first piezoelectric body 144 may be stretched according to a high frequency electrical signal applied by the first lower electrode 142 and the first upper electrode 146 so as to convert the high frequency electrical signal into mechanical vibrations.

The first piezoelectric body 144 may have a predetermined thickness and be formed by a suitable thin film deposition process such as, for example, sputtering, CVD, or evaporation, and may be given a suitable predetermined shape using, for example, photolithography. In some embodiments, the shape of the first piezoelectric body 144 may be the same as the shape of the first lower electrode 142. In some embodiments, the first piezoelectric body 144 may have a smaller area than the first lower electrode 142, but larger than the area of the void 122-1 on which it is disposed. The thickness of the first piezoelectric body 144 may be determined by considering factors including, but not limited to, intrinsic acoustic impedance or density, speed of sound, and wavelength of an applied or desired signal.

The first upper electrode 146 may be formed on a top surface of the first piezoelectric body 144. Thus, the first piezoelectric body 144 may be disposed (or sandwiched) between the first lower electrode 142 and the first upper electrode 146. The first lower electrode 142 and the first upper electrode 146 are used for applying the high frequency electrical signal to the first piezoelectric body 144. The first upper electrode 146 may be formed of suitable electrically conducting material such as, for example, manganese (Mn), gold (Au), aluminum (Al), copper (Cu), and silver (Ag) or conducting alloys thereof. The first upper electrode 146 may have a predetermined thickness and be formed by a suitable thin film deposition process such as, for example, sputtering, CVD, or evaporation, and may be given a suitable predetermined shape using, for example, photolithography.

Because the first upper electrode 146 functions as an electrode and as a resonating unit at the same time, it is desirable to determine the thickness of the first upper electrode 146 with precision by considering factors including, but not limited to, intrinsic acoustic impedance or density, speed of sound, and wavelength of an applied or desired signal.

Further, instead of the first lower electrode 142, the first upper electrode 146 may alternatively be electrically connected to the first connector 130a of the substrate 120.

The second resonator 160 is disposed on the other of the voids 122 (e.g., 122-2). In some embodiments, the second resonator 160 may be a shunt resonator. In some embodiments, the second resonator 160 may be a bulk acoustic wave filter. In such embodiments, the second resonator 160 includes a second lower electrode 162, a second piezoelectric body 164, and a second upper electrode 166.

The second lower electrode 162 is disposed on the void 122-2, and serves to apply a high frequency voltage to the second piezoelectric body 164. Accordingly, the second lower electrode 162 may be formed of a suitable electrically conducting material such as, for example, manganese (Mn), gold (Au), aluminum (Al), copper (Cu), and silver (Ag), or conducting alloys thereof. The second lower electrode 162 may have a predetermined thickness and be formed by a suitable thin film deposition process such as, for example, sputtering, CVD, or evaporation. The second electrode 162 may have any suitable shape such as, for example, a circle, an ellipse, a square, a triangle, a convex regular or irregular polygon, or any other suitable shape that serves to optimize the geometric and acoustic efficiency of the resonators. The shape of the second lower electrode 162 can be provided using a suitable process such as, for example, photolithography.

Because the second lower electrode 162 may be a component forming the second resonator 160, thickness of the second lower electrode 162 is determined by considering factors such as, for example, intrinsic acoustic impedance or density of the material, speed of sound, and wavelength of an applied or desired signal in order for the bulk acoustic wave (BAW) resonator to exhibit desired resonance characteristics.

The second lower electrode 162 may be formed at the same time as the formation of the first lower electrode 142. Thus, the material and thickness of the second lower electrode 162 may be the same as that of the first lower electrode 142.

However, the second lower electrode 162 is not limited thereto, but may also be formed by a process different from the first lower electrode 142, and thus, may have a different material and thickness than the first lower electrode 142.

In addition, the second lower electrode 162 may be sized such that the second lower electrode 162 seals the void 122-2 from the top.

Further, the second lower electrode 162 may be electrically connected to the second connector 130b of the substrate 120.

The second piezoelectric body 164 is formed on a top surface of the second lower electrode 162. In such configuration, the second lower electrode 162 is between the substrate 120 and the second piezoelectric body 164. The second piezoelectric body 164 may be formed of a suitable piezoelectric material such as, for example, quartz, zinc oxide (ZnO), aluminum nitride (AlN), lead zirconate titanate (PZT), barium titanate ($BaTiO_3$), or variations thereof. In addition, the second piezoelectric body 164 may be stretched according to a high frequency electrical signal applied by the second lower electrode 162 and the second upper electrode 166 so as to convert the electrical signal into mechanical vibrations.

The second piezoelectric body 164 may have a predetermined thickness and be formed by a suitable thin film deposition process such as, for example, sputtering, CVD, or evaporation, and may be given a suitable predetermined shape using, for example, photolithography. In some embodiments, the shape of the second piezoelectric body 164 may be the same as the shape of the second lower electrode 162. In some embodiments, the second piezoelectric body 164 may have a smaller area than the second lower electrode 162, but larger than the area of the void 122-2 on which it is disposed. The thickness of the second piezoelectric body 164 is determined by considering factors such as, for example, intrinsic acoustic impedance or density, speed of sound, and wavelength of an applied or desired signal.

The second piezoelectric body 164 may be shaped simultaneously with the first piezoelectric body 144, or may also be shaped by a separate process. Similarly, the thickness of the second piezoelectric body 164 may also be same or different from the thickness of the first piezoelectric body 144.

The second upper electrode 166 is formed on a top surface of the second piezoelectric body 164. Thus, the second piezoelectric body 164 may be disposed (or sandwiched) between the second lower electrode 162 and the second upper electrode 166. The second lower electrode 162 and the second upper electrode 166 are used for applying the high frequency electrical signal to the second piezoelectric body 164. The second upper electrode 166 may be formed of a suitable electrically conducting material. Examples of suitable materials for the second upper electrode 166 include, but are not limited to metals such as, for example, manganese (Mn), gold (Au), aluminum (Al), copper (Cu), and silver (Ag), or alloys thereof. The second upper electrode 166 may have a predetermined thickness and be formed by any suitable thin film deposition process such as, for example, sputtering, CVD, and evaporation and may be given a suitable predetermined shape using, for example, photolithography.

Because the second upper electrode 166 functions as an electrode and as a resonating unit at the same time, it is desirable to determine the thickness of the second upper electrode 166 with precision by considering such as, for example, intrinsic acoustic impedance or density, speed of sound, and wavelength of an applied or desired signal.

The second upper electrode 166 may be shaped simultaneously with the first upper electrode 146, or may be shaped by a separate process. In addition, the thickness of the second upper electrode 166 may be the same or different from the thickness of the first upper electrode 146.

Further, instead of the second lower electrode 162, the second upper electrode 166 may alternatively be electrically connected to the second connector 130*b* of the substrate 120.

The variable capacitor 180 is formed in the first connector 130*a* and the second connector 130*b*, and may serve to adjust a resonant frequency of the acoustic wave filter 100. In an embodiment, the variable capacitor 180 includes a first electrode 182 disposed in the first connector 130*a*, and a second electrode 184 disposed in the second connector 130*b*.

The first electrode 182 of the variable capacitor 180 includes a first plate 182*a*, and first extensions 182*b* extending from the first plate 182*a*. In an embodiment, the first extensions 182*b* may extend from the first plate 182*a* in the shape of comb-teeth. The first electrode 182 of the variable capacitor 180 may be formed in the first connector 130*a* connected to the first resonator 140, and may include the first plate 182*a* and the first extensions 182*b*. It will be apparent after an understanding of the disclosure of the present application that while the figures show three first extensions 182*b*, any number of first extensions 182*b* may be provided. Similarly, while the first extensions 182*b* have been shown to have a rectangular shape, other convex or non-convex shapes are also contemplated. For example, the first extensions 182*b* may be trapezoidal in shape.

The second electrode 184 of the variable capacitor 180 includes a second plate 184*a*, and second extensions 184*b* extending from the second plate 184*a*. In an embodiment, the first extensions 182*b* may extend from the first plate 182*a* in the shape of comb-teeth.

That is, the second electrode 184 of the variable capacitor 180 may be formed in the second connector 130*b* connected to the second resonator 160, and may include the second plate 184*a* and the second extensions 184*b* It will be apparent after an understanding of the disclosure of the present application that while the figures show three second extensions 184*b*, any number of second extensions 184*b* may be provided. Similarly, while the second extensions 184*b* have been shown to have a rectangular shape, other convex or non-convex shapes are also contemplated. For example, the second extensions 184*b* may be trapezoidal in shape.

The second extension 184*b* are disposed to be inserted into spaces formed by the first extension 182*b*, such that the first extensions 182*b* and second extensions 184*b* may be alternately disposed. For example, the first extensions 182*b* and the second extensions 184*b* may be shaped like interdigitated comb-teeth extending from opposing plates (i.e., the first plate 182*a* and the second plate 184*a* respectively).

It will be apparent after an understanding of the disclosure of the present application that the first electrode 182 and the second electrode 184 may have any suitable shape. Thus, while the drawings illustrate the first electrode 182 and the second electrode 184 both to be substantially straight, the embodiments are not limited thereto. For example, the first electrode 182 and the second electrode 184 may have curved shapes, or other convex or non-convex shapes. Further, the first electrode 182 and the second electrode 184 (including the respective plates and extensions) may be formed using any suitable conducting material such as, for example, manganese (Mn), gold (Au), aluminum (Al), copper (Cu), silver (Ag) or an alloy thereof that is amenable to the fabrication process by which the acoustic wave filter 100 is fabricated.

It will be apparent after an understanding of the disclosure of the present application that although not illustrated in the drawings, a dielectric may be filled in spaces formed by the first electrode 182 and second electrode 184.

Accordingly, the resonant frequency of the acoustic wave filter 100 may be timed by changing a capacitance value of the acoustic wave filter 100 using the variable capacitor 180 disposed between the first and second resonators 140 and 160.

In other words, the resonant frequency of the acoustic wave filter 100 may be tuned by connecting the variable capacitor 180 to each of the first resonator and the second resonator. As used herein, the tuning of the frequency also refers to tuning the frequency by changing the capacitance value simultaneously while evaluating characteristics of the acoustic wave filter 100 at the time of performing a wafer level test.

Accordingly, the frequency tuning may be performed for each of the first resonator and the second resonator without requiring additional fabrication process. Further, the frequency tuning may be performed while evaluating characteristics even after packaging. Thus, defects caused variation in the resonant frequency of individual resonators which may occur during post-processing may be prevented or corrected.

Hereinafter, a method for manufacturing an acoustic wave filter according to an embodiment will be described with reference to the drawings.

Figure 4:
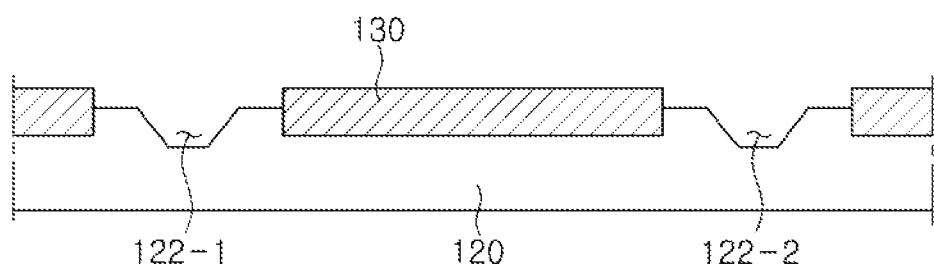
FIG. 4 is a cross-sectional view illustrating an acoustic wave filter during a process of preparing a substrate of the acoustic wave filter.

FIG. 4 is a cross-sectional view illustrating an acoustic wave filter during an example of a process of shaping a substrate of the acoustic wave filter.

Referring to FIG. 4, after voids 122 are formed in a substrate 120, a connector 130 is formed in a space between the voids 122. The substrate 120 may be a suitable semiconductor substrate such as, for example, a silicon substrate, a silicon on insulator (SOI) type substrate, or a substrate of any other material amenable to semiconductor manufacturing processes. The voids 122 may be formed by an etching process such as, for example, wet etching, reactive ion etching, ion milling, or ion beam etching using suitable reactants. For example, in embodiments where a silicon substrate is to be etched using a wet etching process, potassium hydroxide, tetramethyl ammonium hydroxide (TMAH), or TMAH-isopropyl alcohol may be used as an etchant for anisotropic etching of the silicon substrate. In other embodiments, a solution of hydrofluoric acid (HF) and nitric acid ($HNO_3$) may be used for isotropic etching of silicon. Dry etching process (e.g., RIE) may use plasma of gases such as, for example, $CF_4$, $SF_6$, or $NF_3$.

Although the drawings illustrate an embodiment in which two voids 122 (i.e., 122-1, 122-2) are formed, the number of voids 122 is not limited thereto. For example, two or more voids 122 may be formed.

The voids 122 may have a cross section of approximately a trapezoidal shape, as illustrated in FIG. 2. That is, the voids 122 may have a funnel shape obtained, for example, using an anisotropic etch. Although FIG. 2 illustrates an example in which the voids 122 have the trapezoidal shape, the shape of the voids 122 is not limited thereto. For example, the shape of the voids 122 may be variously varied.

The connector 130 may serve to electrically connect the first resonator 140 and the second resonator 160 formed on voids 122-1 and 122-2 respectively, and electrically connect an external power source to the first resonator 140 and second resonator 160 at the same time.

Figure 5:
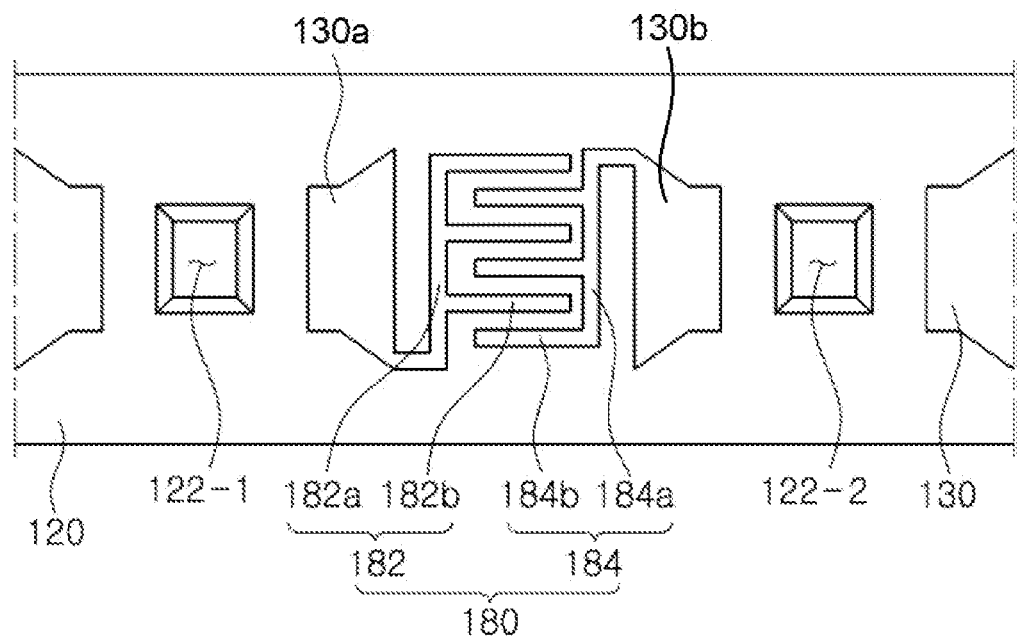
FIG. 5 is a plan view illustrating an acoustic wave filter during an example of a process of forming the variable capacitor of the acoustic wave filter.

FIG. 5 is a plan view illustrating an acoustic wave filter during an example of a process of shaping the variable capacitor of the acoustic wave filter.

Referring to FIG. 5, a variable capacitor 180 is formed in the first connector 130a and the second connector 130b. In an embodiment, the variable capacitor 180 includes a first electrode 182 and a second electrode 184.

The first electrode 182 includes a first plate 182a, and first extensions 182b extending from the first plate 182a. For example, the first electrode 182 may be formed in the first connector 130a, connected to the first resonator 140, and may include the first plate 182a and the first extensions 182b.

The second electrode 184 includes a second plate 184a, and second extensions 184b extending from the second plate 184a. The second electrode 184 may be formed in the second connector 130b connected to the second resonator 160, and may include the second plate 184a and the second extensions 184b.

In addition, the second extension parts 184b are disposed to be inserted into spaces formed by the first extension parts 182b, such that the first and second extension parts 182b and 184b may be alternately disposed.

The first electrode 182 and the second electrode 184 may be formed using any suitable process. For example, in an embodiment, a suitable conducting material such as, for example, manganese (Mn), gold (Au), aluminum (Al), copper (Cu), silver (Ag) or and alloy thereof is deposited using a suitable process such as, for example, sputtering, CVD, or evaporation. The shapes for the first electrode 182 and the second electrode 184 (including the respective plates and extensions) are defined using a process such as, for example, photolithography, followed by etching the conducting material using a wet or a dry etchant to form the first electrode 182 and the second electrode 184. It will be apparent after an understanding of the disclosure of the present application that other processes compatible with the process used for fabrication of the acoustic wave filter may also be used. For example, instead of photolithography, the first electrode 182 and the second electrode 184 may be formed by laser ablation of unwanted portions of the conducting material. Other processes are contemplated within the scope of the disclosure of the present application.

Although not explicitly illustrated in the drawings, a dielectric may be filled in spaces formed by the first and second electrodes 182 and 184. Examples of a suitable dielectric include, but are not limited to, air, silicon dioxide ($SiO_2$), silicon nitride ($Si_3N_4$), aluminum oxide ($Al_2O_3$), polydimethyl siloxane (PDMS), and polyimide. The dielectric (when other than air) may be deposited or spin-coated on to the substrate 120 after or during formation of the first electrode 182 and second electrode 184. Deposition may include, for example, chemical vapor deposition, or pulsed vapor deposition. In embodiments where the dielectric is spin-coated, an annealing step may follow the spin-coating process.

Figure 6:
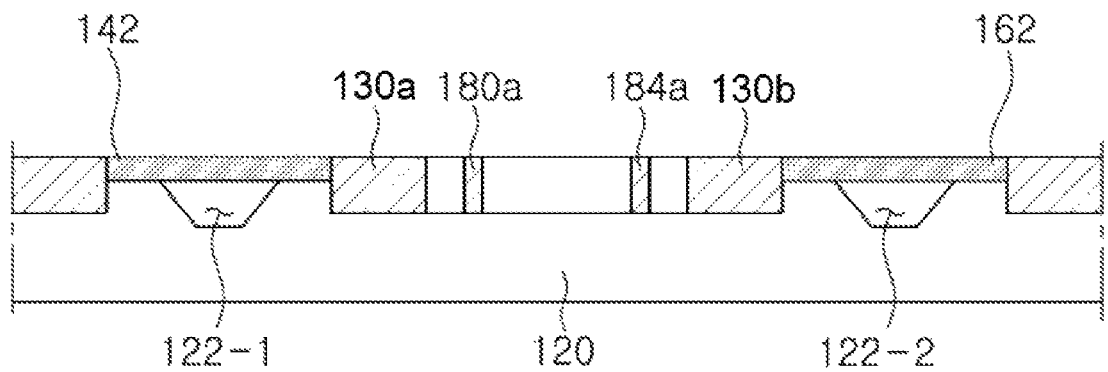
FIGS. 6 through 8 are cross-sectional views illustrating an acoustic wave filter during an example of a process of forming the first and second resonators.
Figure 7:
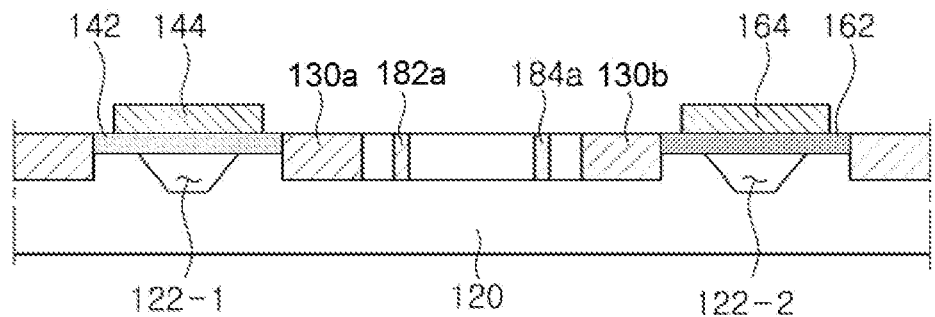
Figure 8:
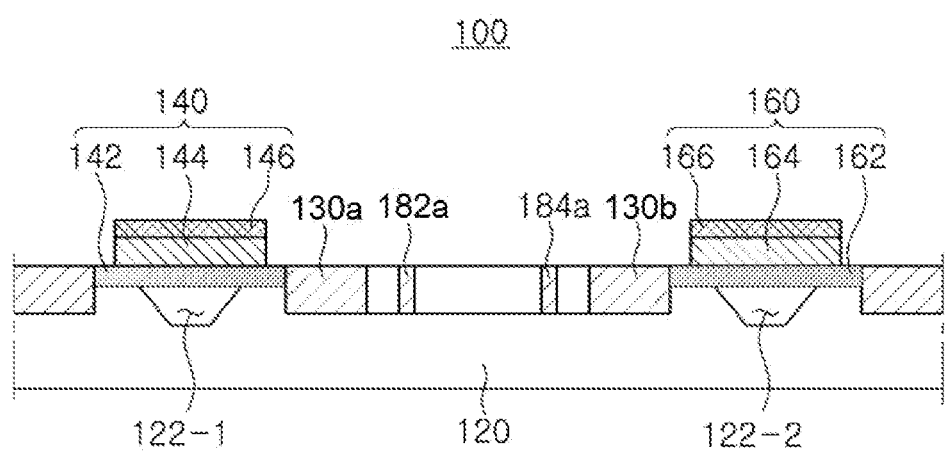

FIGS. 6 through 8 are cross-sectional views illustrating an acoustic wave filter during an example of a process of forming first and second resonators.

FIG. 6 illustrates the cross-section of the acoustic wave filter during a process of forming first lower electrode and second lower electrode on the substrate, FIG. 7 illustrates the cross-section of the acoustic wave filter during a process of forming first piezoelectric body and second piezoelectric body on the first lower electrode and the second lower electrode, and FIG. 8 illustrates the cross-section of the acoustic wave filter during a process of forming first upper electrode and second upper electrode on the first piezoelectric body and the second piezoelectric body.

Referring to FIGS. 6 through 8, the first lower electrode 142 and the second lower electrode 162 are formed on the substrate 120. As an example, the first lower electrode 142 and the second lower electrode 162 may be formed to seal the voids 122-1 and 122-2 respectively. The first lower electrode 142 and the second lower electrode 162 may be formed of a suitable electrically conducting material such as, for example, manganese (Mn), gold (Au), aluminum (Al), copper (Cu), and silver (Ag), or conducting alloys thereof. The first lower electrode 142 and the second lower electrode 162 may have a predetermined thickness and be formed by a suitable thin film deposition process such as, for example, sputtering, CVD, or evaporation. The first lower electrode 142 and the second lower electrode 162 may have any suitable shape such as, for example, a circle, an ellipse, a square, a triangle, a convex regular or irregular polygon, or any other suitable shape that serves to optimize the geometric and acoustic efficiency of the resonators. The shape of the first lower electrode 142 and the second lower electrode 162 can be provided using a suitable process such as, for example, photolithography.

Because the first lower electrode 142 and the second lower electrode 162 may be components forming the first and second resonators 140 and 160 respectively, thicknesses of the first and second lower electrodes 142 and 162 determined by considering factors such as, for example, intrinsic acoustic impedance or density of the material, speed of sound, and wavelength of an applied or desired signal, and the like in order for the bulk acoustic wave (BAW) resonator to exhibit desired resonance characteristics.

Although the drawings illustrate an embodiment in which the first and second lower electrodes 142 and 162 are simultaneously formed, the first lower electrode 142 and the second lower electrode 162 may also be formed by different processes. In other words, in a case in which the first and second lower electrodes 142 and 162 are formed of different materials, the second lower electrode 162 may be separately formed after the first lower electrode 142 is formed, or vice versa.

The first piezoelectric body 144 is formed on the top surface of the first lower electrode 142, and the second piezoelectric body 164 is formed on the top surface of the second lower electrode 162. For example, the first and second piezoelectric bodies 144 and 164 may be formed of a piezoelectric material such as, for example, quartz, zinc oxide (ZnO), aluminum nitride (AlN), lead zirconate titanate (PZT), barium titanate ($BaTiO_3$), or variations thereof.

The first and second piezoelectric bodies 144 and 164 are formed on the first and second lower electrodes 142 and 162, respectively. The first piezoelectric body 144 and the second piezoelectric body 164 have a predetermined thickness and may be formed by a suitable thin film such as, for example, sputtering, CVD, evaporation, or pulsed laser deposition, and may be given a suitable predetermined shape using, for example, photolithography. The thicknesses of the first and second piezoelectric bodies 144 and 164 are be determined by considering factors such as, for example, intrinsic acoustic impedance or density, speed of sound, and wavelength of an applied or desired signal.

Although the drawings illustrate an embodiment in which the first and second piezoelectric bodies 142 and 162 are simultaneously formed, the first and second piezoelectric bodies 142 and 162 may be formed by different processes. In other words, in an embodiment in which the first and second piezoelectric bodies 144 and 164 are formed of different materials, the second piezoelectric body 164 may be separately formed after the first piezoelectric body 144 is formed, and vice versa.

The first upper electrode 146 is formed on the top surface of the first piezoelectric body 144, and the second upper electrode 166 is formed on the top surface of the second piezoelectric body 164. The first and second upper electrodes 146 and 166 may be formed of a suitable electrically conducting material such as, for example, manganese (Mn), gold (Au), aluminum (Al), copper (Cu), and silver (Ag), or conducting alloys thereof. The first upper electrode 146 and the second upper electrode 166 may have a predetermined thickness and be formed by a suitable thin film deposition process such as, for example, sputtering, CVD, or evaporation. The first upper electrode 146 and the second upper electrode 166 may have any suitable shape such as, for example, a circle, an ellipse, a square, a triangle, a convex regular or irregular polygon, or any other suitable shape that serves to optimize the geometric and acoustic efficiency of the resonators. The shape of the first upper electrode 146 and the second upper electrode 166 can be provided using a suitable process such as, for example, photolithography.

Although the drawings illustrate an embodiment in which the first and second upper electrodes 146 and 166 are simultaneously formed, the first and second upper electrodes 146 and 166 may be formed by different processes. In other words, in an embodiment in which the first and second upper electrodes 146 and 166 are formed of different materials, the second upper electrode 166 may be separately formed after the first upper electrode 146 is formed, and vice versa.

Figure 9:
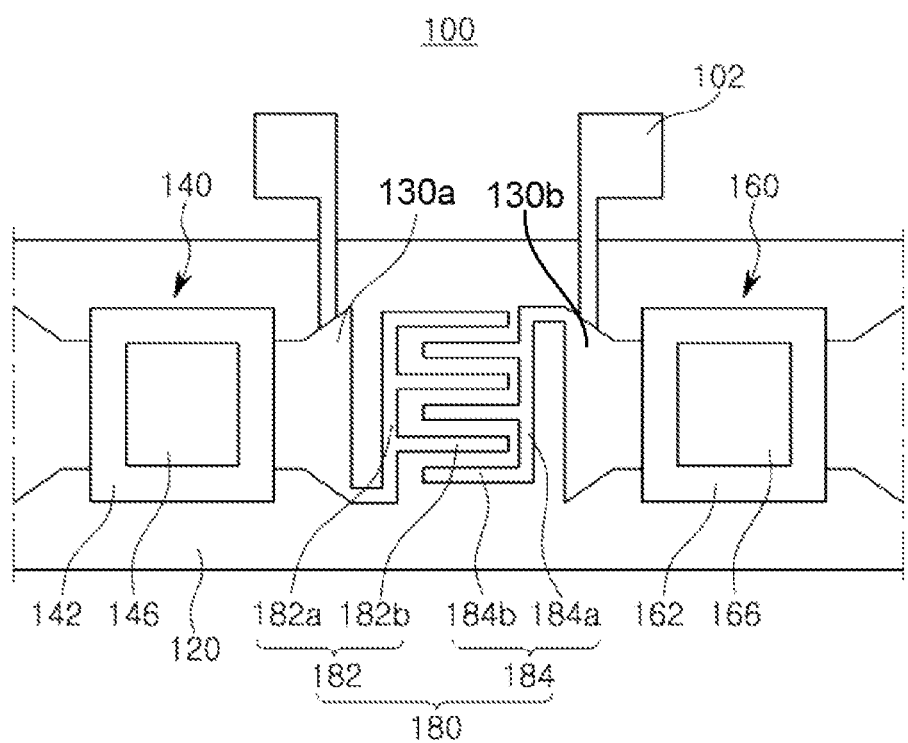
FIG. 9 is a plan view illustrating an acoustic wave filter during an example of a process of adjusting a frequency by applying a voltage to the variable capacitor.

FIG. 9 is a plan view illustrating an acoustic wave filter during an example of a process of adjusting a frequency by applying a voltage to the variable capacitor.

Referring to FIG. 9, a frequency is adjusted by adjusting a capacitance value simultaneously with evaluating characteristics of the acoustic wave filter 100 while performing a wafer level test. A voltage is applied to the variable capacitor 180 by connecting tuning electrodes 102 to the first connector 130a and the second connector 130b connected to the terminal, of the variable capacitor 180, respectively. Accordingly, a pass band frequency may be adjusted.

Accordingly, because the pass band frequency may be adjusted by applying the voltage to the variable capacitor 180 using the tuning electrodes 102, provision of trimming layers in the first and second resonators 140 and 160 may be avoided.

Accordingly, because a process of adjusting a frequency by an etching of the trimming layers may be omitted, a fabrication process such as an additional photolithography may be omitted, thereby resulting in improved manufacturing yield as well as machining precision.

Further, because the frequency adjustment may be performed in an operation of evaluating characteristics after a packaging, an occurrence of defect according to variation in frequency which may occur during a post-process may be avoided, or corrected.

As set forth above, according to embodiments in the present disclosure, the process frequency tuning of the acoustic wave filter may be simplified.

Further, the degradation of the manufacturing yield and the occurrence of defect may be decreased.

Although specific terminology has been used in this disclosure, for example, resonating part, it will be apparent after an understanding of the disclosure of this application that different terminology may be used to describe the same features, and such different terminology may appear in other applications.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter comprising:
   a substrate;
   a first resonator disposed on the substrate;
   a second resonator disposed on the substrate and spaced apart from the first resonator; and
   a variable capacitor comprising a first electrode electrically connected to the first resonator, and a second electrode electrically connected to the second resonator,
   wherein the first electrode comprises a first plate, and first extensions extending from the first plate, the first extensions being spaced apart from each other,
   wherein the second electrode comprises a second plate, and second extensions extending from the second plate, the second extensions being spaced apart from each other, and disposed in spaces formed by the first extensions, such that the first extensions and second extensions are alternately disposed, and
   wherein spaces between the first extensions and the second extensions are filled with a dielectric material.

2. The acoustic wave filter of claim 1, wherein the first resonator comprises:
   a first lower electrode disposed on the substrate and electrically connected to the first electrode;
   a first piezoelectric body disposed on a top surface of the first lower electrode; and
   a first upper electrode disposed on a top surface of the first piezoelectric body,
   wherein the top surface of the first lower electrode is disposed opposite a bottom surface of the first lower electrode, and the bottom surface of the first lower electrode faces the substrate.

3. The acoustic wave filter of claim 1, wherein the second resonator comprises:
   a second lower electrode disposed on the substrate and electrically connected to the second electrode;
   a second piezoelectric body disposed on a top surface of the second lower electrode; and
   a second upper electrode disposed on a top surface of the second piezoelectric body,
   wherein the top surface of the second lower electrode is disposed opposite a bottom surface of the second lower electrode, and the bottom surface of the second lower electrode faces the substrate.

4. The acoustic wave filter of claim 1, wherein the substrate comprises voids on which the first and second resonators are disposed.

5. The acoustic wave filter of claim 1, wherein the first extensions and the second extensions are interdigitated.

6. The acoustic wave filter of claim 1, wherein the variable capacitor is configured to have capacitance dependent on a voltage applied across the electrodes of the variable capacitor.

7. The acoustic wave filter of claim 1, wherein a height of the first extensions, measured from a bottom surface of the first extensions to a top surface of the first extensions, is greater than a width of the first extensions, measured from one side surface to another side surface of the first extensions.

8. The acoustic wave filter of claim 1, wherein a height of the second extensions, measured from a bottom surface of the second extensions to a top surface of the second extensions, is greater than a width of the second extensions, measured from one side surface to another side surface of the second extensions.

9. The acoustic wave filter of claim 1, wherein a height of the first extensions, measured from a bottom surface of the first extensions to a top surface of the first extensions, is greater than a distance measured from one side surface of the first extensions to one side surface of the second extensions adjacent to the first extensions.

10. The acoustic wave filter of claim 1, wherein a height of the second extensions, measured from a bottom surface of the second extensions to a top surface of the second extensions, is greater than a distance measured from one side surface of the first extensions to one side surface of the second extensions adjacent to the first extensions.

11. An acoustic wave filter comprising:
a first resonator disposed on a substrate;
a second resonator disposed on the substrate and spaced apart from the first resonator; and
a variable capacitor comprising a first electrode electrically connected to the first resonator, and a second electrode electrically connected to the second resonator,
wherein the first electrode comprises a first plate, and first extensions extending from the first plate, the first extensions being spaced apart from each other,
wherein the second electrode comprises a second plate, and second extensions extending from the second plate, the second extensions being spaced apart from each other, and disposed in spaces formed by the first extensions, such that the first extensions and second extensions are alternately disposed, and
wherein a height of the first extensions, measured from a bottom surface of the first extensions to a top surface of the first extensions, is greater than a width of the first extensions, measured from one side surface to another side surface of the first extensions.

12. A method for manufacturing an acoustic wave filter, the method comprising:
forming a first connector and a second connector on a substrate;
forming a variable capacitor including a first electrode disposed in the first connector and a second electrode disposed in the second connector;
forming a first resonator and a second resonator on the substrate to be connected to the first connector and the second connector, respectively, and be disposed on two terminals of the variable capacitor; and
tuning a pass band frequency of the acoustic wave filter by applying a voltage to the variable capacitor,
wherein the first electrode comprises a first plate having first extensions extending therefrom, the first extensions being spaced apart from each other,
wherein the second electrode comprises a second plate having second extensions extending therefrom, the second extensions being spaced apart from each other,
wherein the second extensions are disposed in spaces formed by the first extensions, such that the first extensions and the second extensions are alternately disposed, and
wherein spaces between the first extensions and the second extensions are filled with a dielectric material.

13. The method of claim 12, wherein the tuning the frequency comprises applying the voltage to the variable capacitor by connecting tuning electrodes to the first connector and the second connector, and wherein the first connector and the second connector are connected to the two terminals of the variable capacitor, respectively.

14. The method of claim 12, wherein the forming of the first and second resonators comprises:
forming a first lower electrode and a second lower electrode to be disposed on voids of the substrate;
forming a first piezoelectric body and a second piezoelectric body on the first lower electrode and the second lower electrode respectively; and
forming a first upper electrode and a second upper electrode on the first piezoelectric body and the second piezoelectric body respectively.

15. The method of claim 12, wherein the first resonator comprises:
a first lower electrode disposed on the substrate and electrically connected to the first connector;
a first piezoelectric body disposed on a top surface of the first lower electrode; and
a first upper electrode disposed on a top surface of the first piezoelectric body,
wherein the top surface of the first lower electrode is disposed opposite a bottom surface of the first lower electrode, and the bottom surface of the first lower electrode faces the substrate.

16. The method of claim 12, wherein the second resonator comprises:
a second lower electrode disposed on the substrate and electrically connected to the second connector;
a second piezoelectric body disposed on a top surface of the second lower electrode; and
a second upper electrode disposed on a top surface of the second piezoelectric body,
wherein the top surface of the second lower electrode is disposed opposite a bottom surface of the second lower electrode, and the bottom surface of the second lower electrode faces the substrate.

17. The method of claim 12, wherein the substrate comprises voids on which the first resonator and the second resonator are disposed.

* * * * *